(12) United States Patent
Ryan et al.

(10) Patent No.: US 8,212,346 B2
(45) Date of Patent: Jul. 3, 2012

(54) METHOD AND APPARATUS FOR REDUCING SEMICONDUCTOR PACKAGE TENSILE STRESS

(75) Inventors: E. Todd Ryan, Wappingers Falls, NY (US); Holger Schuehrer, Dresden (DE); Seung-Hyun Rhee, Fishkill, NY (US)

(73) Assignee: Global Foundries, Inc., Grand Cayman (KY)

( * ) Notice: Subject to any disclaimer, the term of this patent is extended or adjusted under 35 U.S.C. 154(b) by 749 days.

(21) Appl. No.: 12/259,357

(22) Filed: Oct. 28, 2008

(65) Prior Publication Data
US 2010/0102435 A1    Apr. 29, 2010

(51) Int. Cl.
*H01L 23/06*    (2006.01)
(52) U.S. Cl. .......................... 257/684; 257/717
(58) Field of Classification Search .................. 257/684, 257/702, 717, 729
See application file for complete search history.

(56) References Cited

U.S. PATENT DOCUMENTS

| | | | |
|---|---|---|---|
| 4,672,421 A | 6/1987 | Lin | |
| 5,852,326 A | 12/1998 | Khandros et al. | |
| 5,936,304 A | 8/1999 | Lii et al. | |
| 5,959,340 A * | 9/1999 | Wan et al. | 257/443 |
| 5,959,348 A * | 9/1999 | Chang et al. | 257/700 |
| 6,049,124 A * | 4/2000 | Raiser et al. | 257/712 |
| 6,156,623 A * | 12/2000 | Hendrix et al. | 438/457 |
| 6,433,419 B2 | 8/2002 | Khandros et al. | |
| 6,465,893 B1 | 10/2002 | Khandros et al. | |
| 6,639,321 B1 * | 10/2003 | Nagarajan et al. | 257/778 |
| 6,750,552 B1 * | 6/2004 | Narayanan | 257/786 |
| 2001/0008776 A1 * | 7/2001 | Lai et al. | 438/106 |
| 2004/0104491 A1 * | 6/2004 | Connell et al. | 257/787 |
| 2004/0121519 A1 * | 6/2004 | Nagarajan et al. | 438/107 |
| 2005/0110168 A1 * | 5/2005 | Chuang | 257/788 |
| 2006/0051938 A1 * | 3/2006 | Connell et al. | 438/460 |
| 2006/0249821 A1 * | 11/2006 | Test | 257/669 |
| 2007/0045824 A1 | 3/2007 | Zhao et al. | |
| 2007/0215985 A1 * | 9/2007 | Chen | 257/622 |
| 2007/0259533 A1 | 11/2007 | Ahn et al. | |
| 2007/0267724 A1 * | 11/2007 | Jeng et al. | 257/632 |
| 2008/0122037 A1 * | 5/2008 | Daubenspeck et al. | 257/618 |

FOREIGN PATENT DOCUMENTS

| | | |
|---|---|---|
| EP | 2 136 394 A1 | 12/2009 |
| WO | 2006119493 A2 | 11/2006 |
| WO | 2008120705 A1 | 10/2008 |

OTHER PUBLICATIONS

Desk Reference Committee ("DSC" Desk Reference Committee "Microelectronics Failure Analysis" Copyright 2004 ASM Int. pp. 496-497).*
International Search Report for PCT/US2009/005838 mailed Mar. 1, 2010.

* cited by examiner

*Primary Examiner* — N Drew Richards
*Assistant Examiner* — Grant Withers
(74) *Attorney, Agent, or Firm* — Ingrassia Fisher & Lorenz, P.C.

(57) ABSTRACT

A semiconductor package is provided having reduced tensile stress. The semiconductor package includes a package substrate and a semiconductor die. The semiconductor die is coupled electrically and physically to the package substrate and includes a stress relieving layer incorporated therein. The stress relieving layer has a predetermined structure and a predetermined location within the semiconductor die for reducing tensile stress of the semiconductor package during heating and cooling of the semiconductor package.

9 Claims, 5 Drawing Sheets

US 8,212,346 B2

METHOD AND APPARATUS FOR REDUCING SEMICONDUCTOR PACKAGE TENSILE STRESS

FIELD OF THE INVENTION

The present invention generally relates to semiconductor packaging, and more particularly relates to semiconductor packaging techniques for reducing undesirable tensile stress on the semiconductor die.

BACKGROUND OF THE INVENTION

Conventional packaging techniques call for attaching a semiconductor die to a package substrate. However, the Coefficient of Thermal Expansion (CTE) of the package substrate, such as an organic substrate, is typically larger than the CTE of the silicon wafer of the semiconductor die. This CTE mismatch between the package substrate and the semiconductor die causes bending or bowing of the semiconductor die when the semiconductor package cools after heating to cure an epoxy adhering the semiconductor die to the package substrate. Thus, after cooling to ambient room temperature, the semiconductor package is in tensile stress. This tensile stress can cause cracking, interface delamination or other failures in copper interconnect layers of the semiconductor die. Also, where low dielectric constant (low-k) materials are used for insulation of interconnects, such low-k materials require porosity. Adding porosity, however, greatly reduces the mechanical strength of the low-k material, making it susceptible to cracking and delamination under the tensile stress induced by CTE mismatch in the semiconductor package.

Accordingly, it is desirable to provide a semiconductor die and method for fabricating such semiconductor die which reduces the tensile stress on the semiconductor die during packaging and when packaged, particularly tensile stress induced by CTE mismatch of the semiconductor die with package substrates such as an organic substrate. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method is provided for fabricating a semiconductor package with reduced tensile stress. The method includes the steps of fabricating a semiconductor die having a stress relieving layer integrally formed therewith and attaching the semiconductor die to a package substrate with an epoxy to form the semiconductor package. The semiconductor package is then heated to adhere the semiconductor die to the package substrate and cure the epoxy. Thereafter, the semiconductor package is cooled. The stress relieving layer has a predetermined structure and a predetermined location within the semiconductor die for reducing the tensile stress of the semiconductor package during the steps of heating and cooling the semiconductor package.

A semiconductor package is provided having reduced tensile stress. The semiconductor package includes a package substrate and a semiconductor die. The semiconductor die is coupled electrically and physically to the package substrate and includes a stress relieving layer incorporated therein. The stress relieving layer has a predetermined structure and a predetermined location within the semiconductor die for reducing tensile stress of the semiconductor package during heating and cooling of the semiconductor package.

BRIEF DESCRIPTION OF THE DRAWINGS

The present invention will hereinafter be described in conjunction with the following drawing figures, wherein like numerals denote like elements, and FIG. 1, comprising

FIG. 2, comprising

FIG. 4, comprising

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1A:
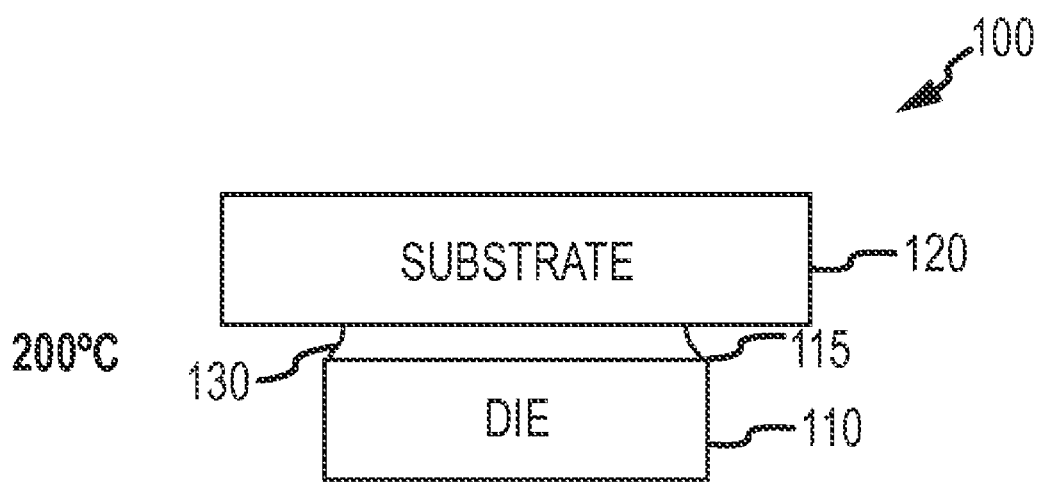
FIGS. 1A and 1B, depict a cross-sectional view illustrating a conventional semiconductor package during fabrication of the package.
Figure 1B:
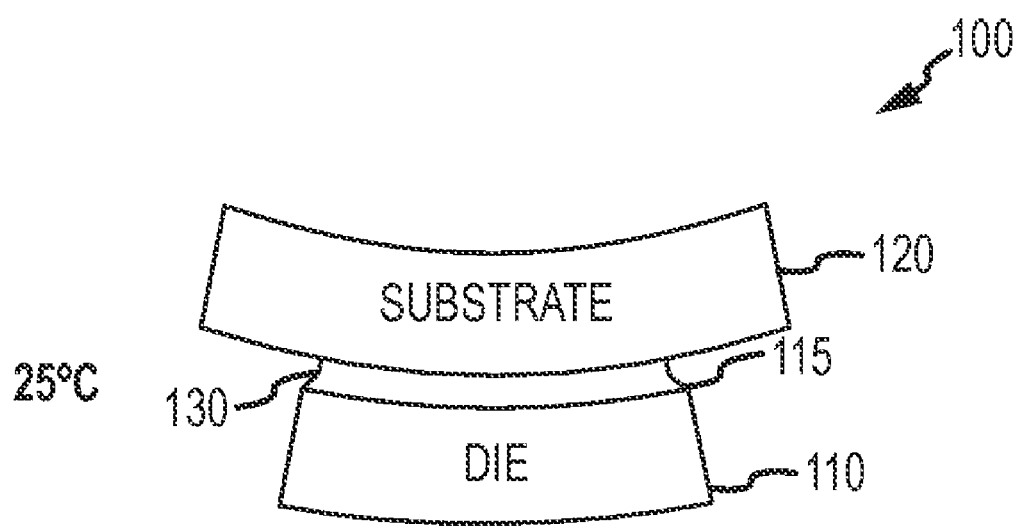

Referring to FIG. 1, comprising FIGS. 1A and 1B, a conventional semiconductor package 100 includes a semiconductor die 110 and a package substrate 120. An epoxy 130 is typically introduced under capillary action into a space between the semiconductor die 110 and the package substrate 120. The epoxy acts to bond the semiconductor die 110 to the package substrate 120. FIGS. 1A and 1B depict the semiconductor package 100 at two different steps during fabrication of the semiconductor package 100.

At the step of fabrication of the semiconductor package 100 shown in FIG. 1A, the semiconductor package 100 is heated to a high temperature to cure the epoxy 130 for attachment of the semiconductor die 110 to the package substrate 120. The high temperature causes the epoxy 130 to adhere the semiconductor die 110 to the package substrate 120. The step of curing the epoxy involves elevating the temperature of the semiconductor package 108 to the high temperature, typically approximately two hundred degrees Centigrade (200° C.), for a specific period of time. Once the curing procedure is complete, the semiconductor package is then cooled to ambient room temperature (approximately 25° C.).

FIG. 1B illustrates the semiconductor package 100 after being cured and cooled to ambient room temperature. Since the Coefficient of Thermal Expansion (CTE) of the package substrate 120 is typically greater than the CTE of the semiconductor die 110, the package substrate 120 tends to reduce in size during cooling at a much faster rate than the semiconductor die 110. This causes the semiconductor package 100 to warp in a manner that results in a bowing or bending of the semiconductor die 110.

Bending or bowing of the semiconductor die 110 is problematic, in that it induces greater stresses along a side 115 of the semiconductor die 110 that attaches to the package substrate 120. Since stress concentrations along edges of the side 115 of the semiconductor die 110 become particularly high, bending of the semiconductor die 110 causes cracks to develop and propagate through the semiconductor die 110. Propagation of these defects can cause severe damage to the semiconductor die 110, and can eventually result in damage to circuitry of the semiconductor die 110, such as damage to copper interconnect layers of the semiconductor die 110 or low dielectric constant (low-k) materials in the semiconductor die 110, possibly resulting in electrical failure of active circuitry of the semiconductor die 110.

The difference in the CTE of the semiconductor die 110 and the package substrate 120 also produces tensile stress and other stresses (e.g., sheer stresses) that act upon the semiconductor package 100, particularly on the epoxy interface 130 that joins the package substrate 120 to the semiconductor die 110. These stresses tend to delaminate the epoxy material 130 from the semiconductor die 110, particularly at the edges of the side 115 of the semiconductor die 110 where higher stress concentrations reside.

Figure 2A:
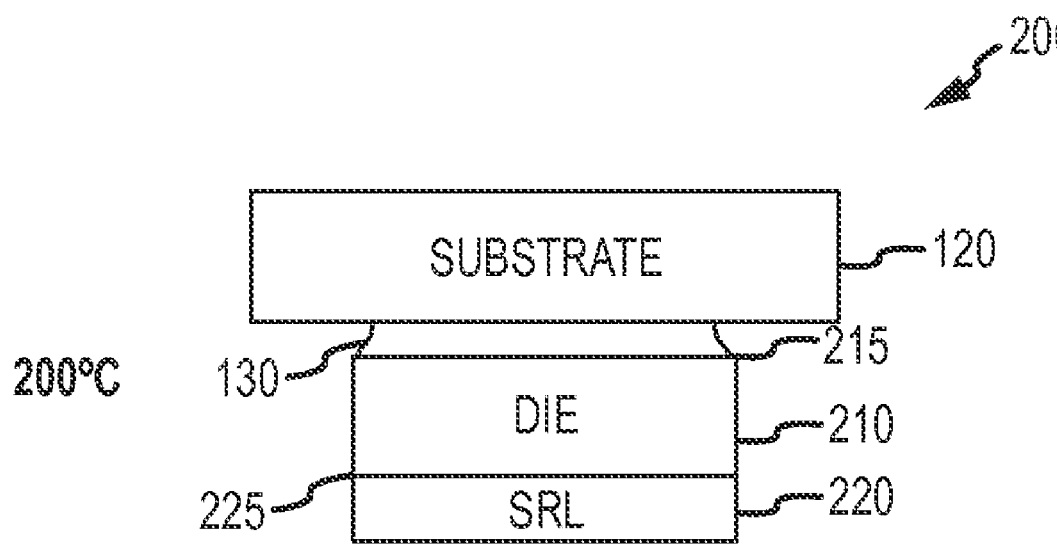
FIGS. 2A and 2B, depict a cross-sectional view illustrating a semiconductor die in accordance with an embodiment of the present invention.
Figure 2B:
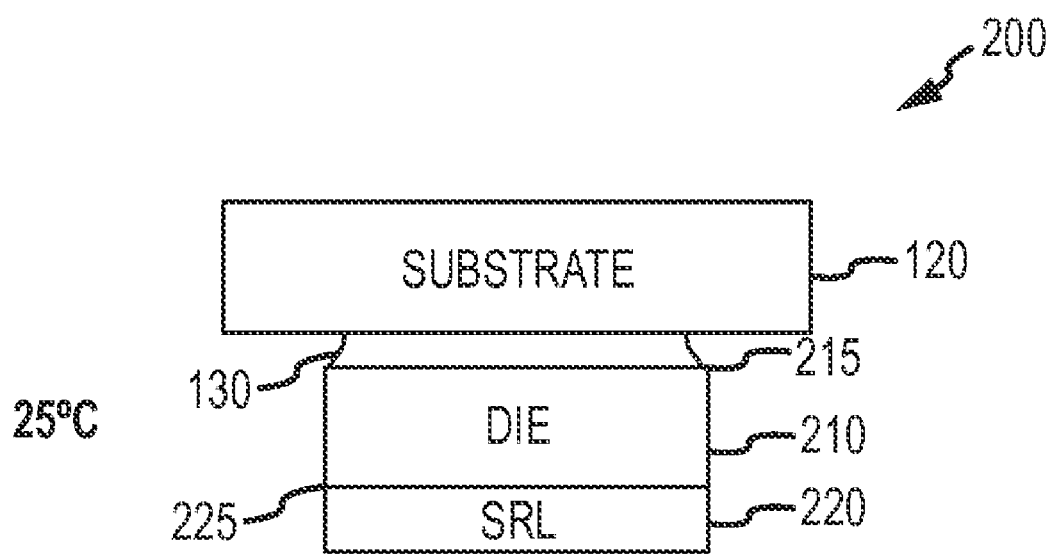

Referring to FIG. 2, comprising FIGS. 2A and 2B, a semiconductor package 200 in accordance with an embodiment of the present invention is depicted at two steps of fabrication of the semiconductor package 200, where FIG. 2A depicts the semiconductor package 200 when heated for curing of the epoxy 130 and FIG. 2B depicts the semiconductor package 200 after subsequent cooling of the semiconductor package 200 to ambient room temperature.

In accordance with the present embodiment, after fabrication of the semiconductor device structures of the semiconductor die 210, a stress relieving layer 220 is formed proximate to a side 225 of the semiconductor die 210 opposite a side 215 of the semiconductor die 210 that is physically coupled to the package substrate 120 by the epoxy 130. In addition to being physically coupled to the package substrate 120, the semiconductor die 210 is electrically coupled to the package substrate 120 by soldering connections (e.g., soldering controlled collapse chip connect (C4) solder connections on the side 215 of the semiconductor die 210 to contact pads on the package substrate 120).

Both the location and a CTE value of the stress relieving layer 220 is predetermined to reduce tensile stress of the semiconductor package 200 during heating and cooling thereof. The stress relieving layer is located on the side 225 of the semiconductor die 210. The CTE value of the stress relieving layer 220 is predetermined by the structure thereof, which is defined by the material of the stress relieving layer 220 and the thickness of the stress relieving layer 220. The material of the stress relieving layer 220 is typically an insulative material such as silicon nitride. The thickness of the stress relieving layer 220 is predetermined to define the CTE value of the stress relieving layer 220 within a CTE range such that the CTE value of the stress relieving layer 220 is greater than a CTE value of the package substrate 120.

Therefore, as seen in FIG. 2B, as the semiconductor package 200 cools to ambient room temperature, both the package substrate 120 and the stress relieving layer 220 attempt to shrink. In this manner, the predetermined structure of the stress relieving layer 220 reduces wafer bowing of the semiconductor die 210 by counteracting the tendency of the package substrate 120 to warp the semiconductor package 200 by bowing or bending the semiconductor die 210, thereby reducing tensile stress of the semiconductor package 200.

Figure 3:
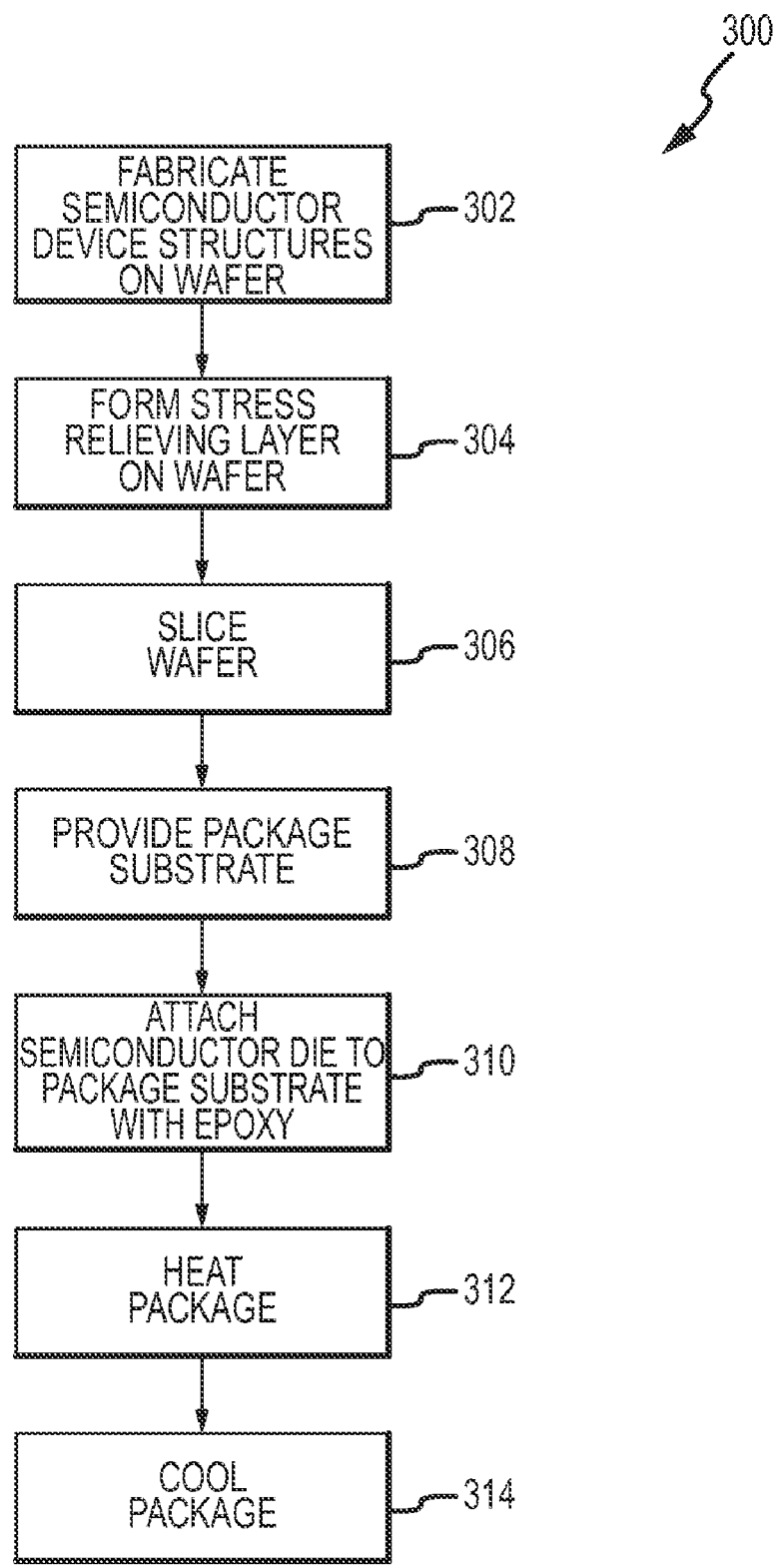
FIG. 3 is a flow diagram of the fabrication process of the semiconductor package of FIG. 2 in accordance with the embodiment of the present invention.

Referring to FIG. 3, a flow diagram 300 of an exemplary fabrication process of the semiconductor package 200 in accordance with the present embodiment is depicted. Initially, semiconductor device structures are fabricated 302 on a semiconductor wafer including the semiconductor die 210. The semiconductor device structures may include transistors, memory cells or any such structures and these semiconductor device structures are fabricated 302 in any one of the multitude of semiconductor fabrication techniques known to those skilled in the art.

Once the semiconductor device structures are fabricated 302 on the wafer, the stress relieving layer 220 is formed 304 on the semiconductor wafer by deposition of an insulative material such as chemical vapor deposition (CVD) of silicon nitride to the underside of the semiconductor wafer underneath the silicon substrate of the bottommost semiconductor device structures fabricated within the semiconductor wafer. Thus, the deposition step 304 forms a silicon-on-insulator (SOI) structure known to those skilled in the art. As set out above, the deposition step 304 is controlled by varying the flow rate and the time of deposition to form the stress relieving layer 220 having a predetermined thickness in order to define the CTE value of the stress relieving layer 220 within the predetermined CTE range (i.e., greater than the CTE value of the package substrate 120).

The fabrication of the semiconductor wafer is thus finished and the wafer is sliced 306 into a plurality of semiconductor dice, including the semiconductor die 210. Next, the package substrate 120 is provided 308 and the semiconductor die 210 is attached 310 to the package substrate 120 with an epoxy. Electrical coupling of the semiconductor die 210 to the package substrate 120 could be any one of several techniques known to those skilled in the art. One such technique includes the steps of providing C4 solder connections on the semiconductor die 210, placing the semiconductor die 210 in contact with the package substrate such that the C4 solder connections are in contact with conductive contact pads on the package substrate 120, and introducing the epoxy under capillary action into a space between the semiconductor die 210 and the package substrate 120.

The semiconductor package 200 is heated 312 to a sufficient high temperature (such as 200° C.) to reflow the solder and cure the epoxy for electrically and physically connecting the semiconductor die 210 to the package substrate 120. After heating 312 for a sufficient time, the semiconductor package 200 is cooled 314 to ambient room temperature to solidify the solder connections and complete curing of the epoxy. In accordance with the present embodiment, the stress relieving layer 220 having the predetermined CTE value within a CTE range greater than the CTE of the package substrate 120 reduces the tensile stress of the semiconductor package 200 at room temperature by offsetting the tendency of the package substrate 120 and semiconductor die 410 to bend or bow due to CTE mismatch thereof. Thus, the stress relieving layer 220 advantageously greatly reduces or prevents defects such as delamination of layers within the semiconductor die 210 due to the warpage thereof, cracks in or damage to copper interconnect layers or high-k dielectric materials within the semiconductor die 210 due to the warpage thereof, or delamination of the epoxy due to the bending or bowing of the package substrate and the semiconductor die 210.

Figure 4A:
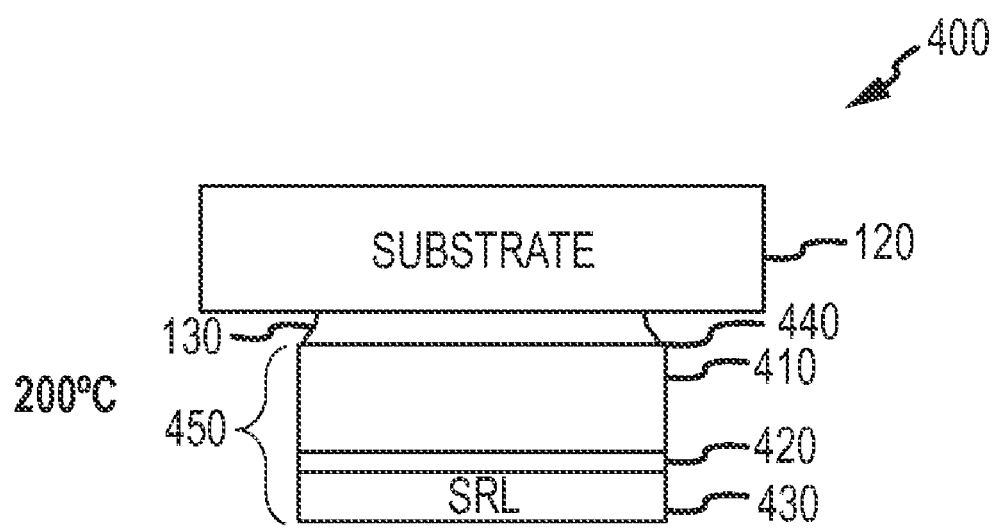
FIGS. 4A and 4B, depict a cross-sectional view illustrating a semiconductor die in accordance with an alternate embodiment of the present invention.
Figure 4B:
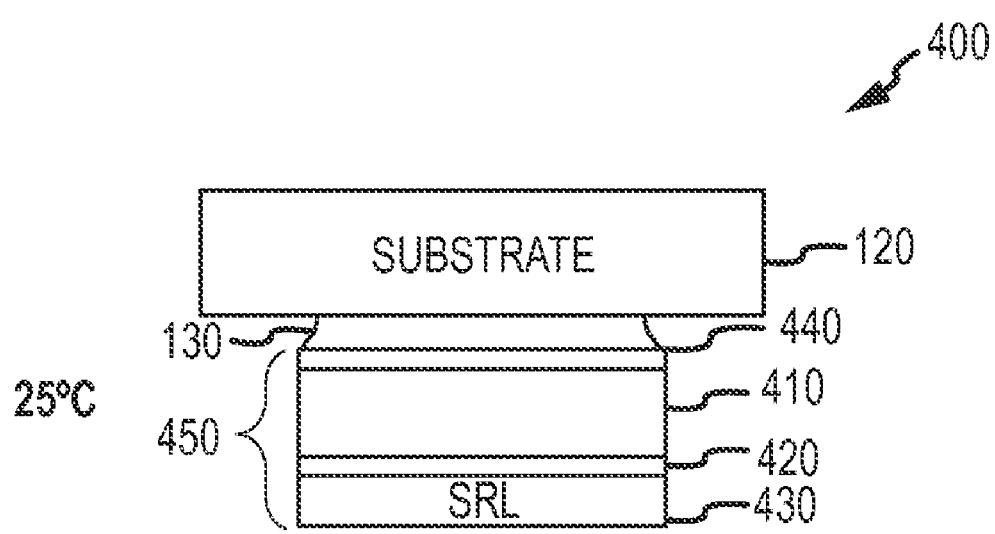

Referring to FIG. 4, comprising FIGS. 4A and 4B, a semiconductor package 400 in accordance with an alternate embodiment of the present invention is depicted at two steps of fabrication of the semiconductor package 400, where FIG. 4A depicts the semiconductor package 400 when heated for curing of the epoxy 130 and FIG. 4B depicts the semiconductor package 400 after subsequent cooling of the semiconductor package 400 to ambient room temperature.

In accordance with the alternate embodiment, prior to fabricating the semiconductor device structures 410 on the silicon substrate 420, a stress relieving layer 430 is formed in or on the silicon substrate 420. The stress relieving layer 430 can be formed in accordance with any of several techniques well-known to those skilled in the art, such as techniques for forming silicon on insulator substrates. For example, implantation, such as ion implantation, can be used to implant ions in the substrate 420 to form the stress relieving layer 430. Alternatively, as depicted in FIG. 4A, the silicon layer 420 could be thinned through known wafer thinning techniques; the thinned wafer then backside polished and the stress relieving layer 430 attached thereto. The parameters of the formation of the stress relieving layer (SRL) are defined such that the CTE value of the stress relieving layer 430 is predetermined to reduce tensile stress of the semiconductor package 400 during heating and cooling. The CTE value of the stress relieving layer 430 is predetermined by the structure thereof, which is defined by the material of the stress relieving layer 430 and the thickness of the stress relieving layer 430. The material of the stress relieving layer 430 in this alternate embodiment may be an insulative material such as silicon nitride and, in the implantation embodiment, could be formed by implantation of nitride ions in the silicon substrate at the desired density. The thickness of the stress relieving layer 430 is predetermined to define the CTE value of the stress relieving layer 430 within a CTE range such that the CTE value of the stress relieving layer 430 is less than a CTE value of the package substrate 120.

When the package 400 is assembled, as shown in FIG. 4A, the location of the stress relieving layer 430 will be opposite to a side 440 of the semiconductor die 450 that is physically coupled to the package substrate 120 by the epoxy 130. In addition to being physically coupled to the package substrate 120, the semiconductor die 450 is electrically coupled to the package substrate 120 by soldering connections (e.g., C4 solder connections on the side 440 of the semiconductor die 450 which are soldered to contact pads on the package substrate 120).

Therefore, as seen in FIG. 4B, as the semiconductor package 400 cools to ambient room temperature, both the package substrate 120 and the stress relieving layer 430 attempt to shrink opposite to each other. The predetermined structure of the stress relieving layer 430 reduces wafer bowing of the semiconductor die 410 by counteracting the tendency of the package substrate 120 to warp the semiconductor package 400 by bowing or bending the semiconductor die 450, thereby reducing tensile stress of the semiconductor package 400.

Figure 5:
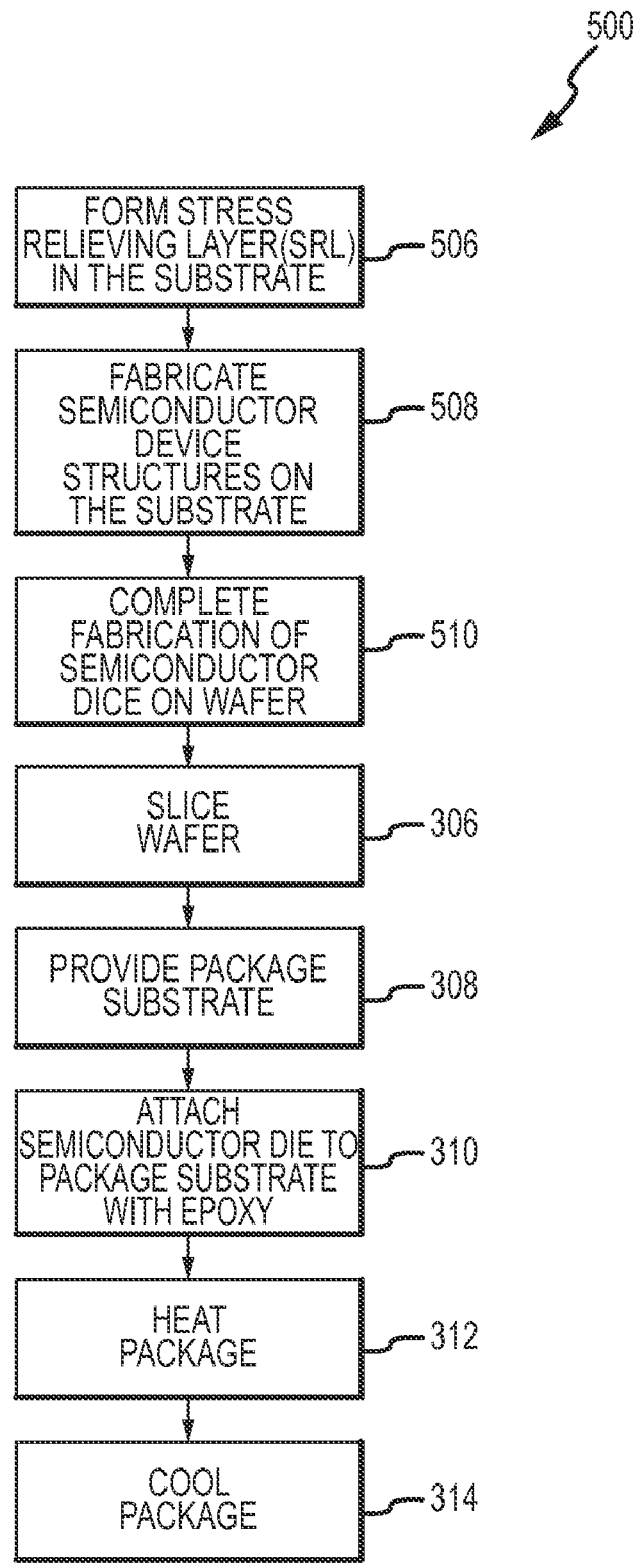
FIG. 5 is a flow diagram of the fabrication process of the semiconductor package of FIG. 4 in accordance with the alternate embodiment of the present invention.

Referring to FIG. 5, a flow diagram 500 of an exemplary fabrication process of the semiconductor package 400 in accordance with the present embodiment is depicted. Initially, the stress relieving layer 430 is formed 506 in the substrate 420 by ion implantation or attached to the substrate 420 after wafer thinning as discussed above. After formation 506 of the stress relieving layer 430 in or on the substrate 420, semiconductor device structures are fabricated 508 on the silicon substrate 420.

The fabrication of the semiconductor wafer is then completed 510 by any further fabrication steps and the semiconductor wafer is sliced 306 into a plurality of semiconductor dice, including the semiconductor die 410. Next, the package substrate 120 is provided 308 and the semiconductor die 450 is attached 310 to the package substrate 120 with an epoxy. Electrical coupling of the semiconductor device structures of the semiconductor die 450 to the package substrate 120 could be any one of several techniques known to those skilled in the art. One such technique includes the steps of providing C4 solder connections on the semiconductor die 450, placing the semiconductor die 450 in contact with the package substrate such that the C4 solder connections are in contact with conductive contact pads on the package substrate 120, and introducing the epoxy under capillary action into a space between the semiconductor die 450 and the package substrate 120.

The semiconductor package 400 is then heated 312 to a sufficient high temperature (such as 200° C.) to reflow the solder and cure the epoxy for electrically and physically connecting the semiconductor die 450 to the package substrate 120. After heating 312 for a sufficient time, the semiconductor package 400 is cooled 314 to ambient room temperature to solidify the solder connections and complete curing of the epoxy. Cooling of the semiconductor package 400 including the semiconductor die 450 having the stress relieving layer 430 formed integrally therein in accordance with this alternate embodiment, reduces the tensile stress of the semiconductor package 400 at room temperature by offsetting the tendency of the package substrate 120 and semiconductor die 450 to bend or bow due to CTE mismatch thereof. Thus, the stress relieving layer 430 in accordance with this alternative embodiment advantageously greatly reduces or prevents defects such as delamination of layers within the semiconductor die 450 due to the warpage thereof, cracks in or damage to copper interconnect layers or high-k dielectric materials within the semiconductor die 450 due to the warpage thereof, or delamination of the epoxy due to the bending or bowing of the package substrate and the semiconductor die 450.

Thus it can be seen that a method for formation of a semiconductor package has been provided wherein the semiconductor die 210, 450 and the package substrate 120 may have coefficients of thermal expansion (CTEs) which differ by a relatively large amount, but the semiconductor package 200, 400 may be formed with reduced (or completely alleviated) defects, cracks and delamination from tensile and sheer stress during heating or cooling of the semiconductor package 200, 400.

While at least one exemplary embodiment has been presented in the foregoing detailed description of the invention, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A semiconductor package comprising:
    a package substrate; and
    a semiconductor die coupled electrically and physically to the package substrate, wherein the semiconductor die includes a stress relieving layer incorporated therein, the stress relieving layer having a predetermined structure and a predetermined location within the semiconductor die for reducing tensile stress of the semiconductor package, wherein the semiconductor die includes a first side portion that has a first side that is physically attached to the package substrate, wherein the stress relieving layer has a first Coefficient of Thermal Expansion (CTE) determined in response to the predetermined structure, the first CTE of the stress relieving layer is different than a die portion CTE of the first side portion of the semiconductor die and is defined within a predetermined CTE range for reducing the tensile stress of the semiconductor package during heating and cooling of the semiconductor package, and wherein the predetermined location of the stress relieving layer is located proximate to a second side of the semiconductor die opposite to the first side, wherein the semiconductor die has a silicon substrate, and wherein the stress relieving layer is a layer formed within the silicon substrate.

2. The semiconductor package in accordance with claim 1, wherein the package substrate has a second CTE, and wherein the predetermined CTE range consists of CTE values greater than the second CTE.

3. The semiconductor package in accordance with claim 1, wherein the package substrate has a second CTE, and wherein the predetermined CTE range consists of CTE values less than the second CTE.

4. The semiconductor package in accordance with claim 1, wherein the predetermined structure of the stress relieving layer comprises a buried oxide layer.

5. The semiconductor package in accordance with claim 1, wherein the predetermined structure of the stress relieving layer comprises a predetermined material having a predetermined thickness, and wherein the predetermined material is an insulative material.

6. The semiconductor package in accordance with claim 5, wherein the insulative material is silicon nitride.

7. A semiconductor die comprising:
one or more semiconductor device structures; and
a stress relieving layer, the stress relieving layer having a predetermined structure and a predetermined location within the semiconductor die for reducing tensile stress of the semiconductor die during heating and cooling of a semiconductor package including the semiconductor die, wherein the semiconductor die includes a first side portion that has a first side for physically attaching to the package substrate, wherein the stress relieving layer has a first Coefficient of Thermal Expansion (CTE) determined in response to the predetermined structure thereof, the first CTE of the stress relieving layer is different than a die portion CTE of the first side portion of the semiconductor die and is defined within a predetermined CTE range for reducing the tensile stress, and wherein the predetermined location of the stress relieving layer is located proximate to a second side of the semiconductor die opposite to the first side, wherein the semiconductor die further comprises a silicon substrate, and wherein the stress relieving layer is formed in the silicon substrate.

8. The semiconductor die in accordance with claim 7, wherein the stress relieving layer has the first Coefficient of Thermal Expansion (CTE) having a CTE value within the predetermined CTE range, and wherein the predetermined CTE range comprises CTE values greater than a CTE of the package substrate.

9. The semiconductor die in accordance with claim 7, wherein the stress relieving layer has the first Coefficient of Thermal Expansion (CTE) having a CTE value within the predetermined CTE range, and wherein the predetermined CTE range comprises CTE values less than a CTE of a package substrate coupleable to the semiconductor die for packaging thereof.

* * * * *